United States Patent [19]

Cohen et al.

[11] Patent Number: 4,474,625

[45] Date of Patent: Oct. 2, 1984

[54] METHOD FOR SUPERFICIAL ANNEALING OF SEMICONDUCTOR MATERIALS USING PULSED MICRO-WAVE ENERGY

[75] Inventors: Joseph Cohen, Venon-Gieres; Georges Kamarinos, St. Martin D'Heres; Pierre Chenevier, Meylan, all of France

[73] Assignee: Centre National De La Recherche Scientifique, Paris, France

[21] Appl. No.: 422,661

[22] Filed: Sep. 24, 1982

[30] Foreign Application Priority Data

Sep. 29, 1981 [FR] France .................................. 81 18656

[51] Int. Cl.³ .................... H01L 21/263; H05B 9/03
[52] U.S. Cl. .................................... 148/1.5; 29/576 B; 29/576 T; 219/10.55 A; 219/10.55 M; 427/39
[58] Field of Search ........... 148/1.5; 29/576 B, 576 T; 219/10.55 A, 10.55 M; 427/39

[56] References Cited

U.S. PATENT DOCUMENTS

| 4,140,887 | 2/1979 | Sutton et al. | 219/10.55 M |
|---|---|---|---|
| 4,221,948 | 9/1980 | Jean | 219/10.55 A |
| 4,243,744 | 1/1981 | Lockwood et al. | 430/325 |
| 4,303,455 | 12/1981 | Splinter et al. | 148/1.5 |
| 4,307,277 | 12/1981 | Maeda et al. | 219/10.55 R |
| 4,323,745 | 4/1982 | Berggren | 219/10.55 A |
| 4,339,648 | 7/1982 | Jean | 219/10.55 M |

FOREIGN PATENT DOCUMENTS

| 27712 | 4/1981 | European Pat. Off. |
| 36157 | 9/1981 | European Pat. Off. |

OTHER PUBLICATION

Halbleiter—Technologie—Ed. Springer Verlog. Berlin, I Ruge et al, 1975 pp. 54–57.

Primary Examiner—Upendra Roy
Attorney, Agent, or Firm—Weingarten, Schurgin, Gagnebin & Hayes

[57] ABSTRACT

The present invention relates to a method for superficial annealing of a semi-conductor wherein a sample of the semi-conductor material is placed inside a cavity resonator, and a microwave pulse is generated inside said resonator, the said pulse being long and strong enough to cause the superficial annealing and/or fusion of the sample and its subsequent re-crystallization.

7 Claims, 1 Drawing Figure

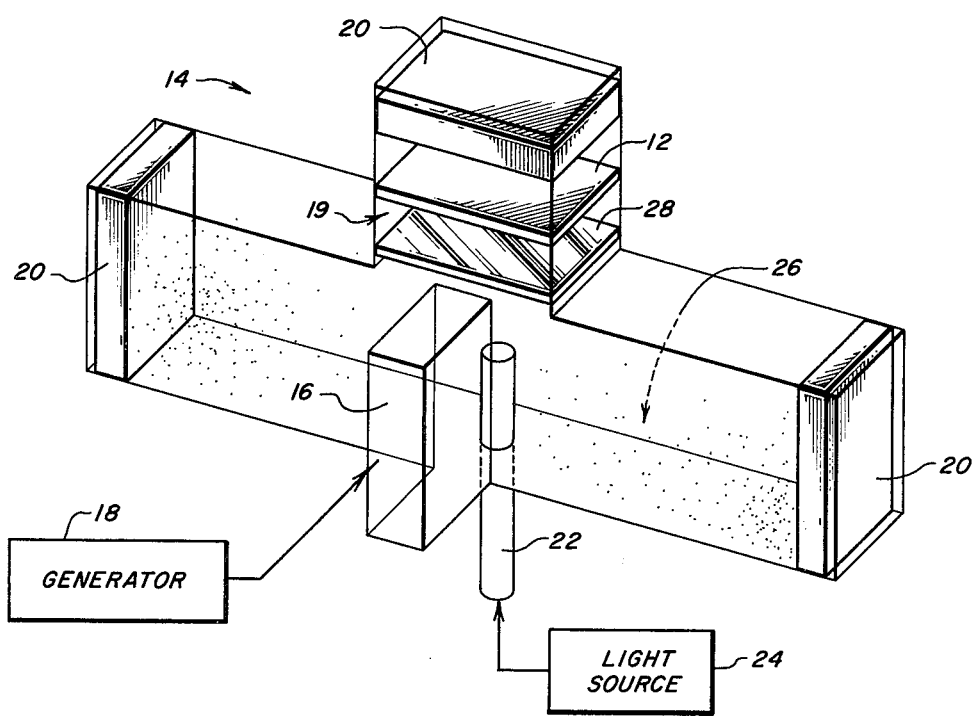

METHOD FOR SUPERFICIAL ANNEALING OF SEMICONDUCTOR MATERIALS USING PULSED MICRO-WAVE ENERGY

FIELD OF THE INVENTION

The present invention relates to the treatment of semi-conductor materials, and more particularly, to the means used to ensure the surface crystallization or re-crystallization of such materials.

BACKGROUND OF THE INVENTION

The treatments which are applied to semi-conductor materials during the manufacture of devices such as diodes, transistors, integrated circuits, solar cells, etc . . . imply one or more annealing phases. These annealings are designed to produce, depending on the cases, one of the following phenomena: crystallization of a layer of an amorphous semi-conductor material deposited on a substrate; re-crystallization in solid or molten phase, then surface re-crystallization of a crystalline material with a view to obtaining a crystal growing; structural reconstitution of a superficial layer destroyed by the ionic implantation of doping impurities; and re-distribution of the doping impurities near the surface of a semi-conductor material.

DESCRIPTION OF THE PRIOR ART

For these purposes, the method currently used consists in placing the semi-conductor material to be treated inside a furnace heated up to a high temperature and in leaving it there for the appropriate time.

Such a technical solution is not satisfactory from the point of view of energy balance. Indeed, the means that need to be used in this case are considerable, costly and energy-consuming to raise the enclosure, inside which the semi-conductor material is deposited, to the required temperature. Moreover, the semi-conductor material has to be kept for long periods of time at a high temperature, this implying the necessity to work inside a completely controlled atmosphere to avoid any pollution from the environment. In addition, such installations do not permit an easy modification of the treatment parameters.

Also with these installations, it is not possible to perform the superficial fusion which would enable to obtain an evenly doped layer from a layer implanted with doping impurities, and after re-crystallization.

It is also possible to treat semi-conductor materials by using a laser beam directed on the surface of the material to be treated. Such a technical means appears to be more adapted to the treatment of superficial layers and in this respect presents an advantage over the previous solution.

Nevertheless, the laser is known to have a low output, this implying a high consumption of energy for carrying out such treatments.

Moreover, if a laser beam is used, there has to be a scanning of the surface to be treated. And since the surface of treated zone which is scanned is small, there results a lack of homogenousness which is prejudicial, and sometimes incompatible with the end purpose which may be, for example, a surface recrystallization or crystal growing.

It should also be noted that the two aforesaid technical solutions are not suitable to obtain dopings giving steep front concentration profiles.

SUMMARY OF THE INVENTION

It is the object of the present invention to overcome the aforesaid drawbacks by proposing a new and rapid method for superficially annealing semi-conductor materials, permitting to treat semi-conductor materials with an excellent energy balance, and in particular permitting the superficial treatment by crystallization or re-crystallization.

Another object of the invention is to propose a method which is quick and practical to use, as well as reliable and virtually instantaneous, that is to say that is does not require any treatment installation preparation phase, such as for example having to raise the initial temperature of the furnaces.

Yet another object of the invention is to propose a treatment method which can be conducted in a white chamber without necessitating a complex installation to prevent the pollution of the semiconductor material.

These objects are reached, according to the invention, by placing a sample of the semi-conductor material inside a cavity resonator, by generating a microwave pulse inside said resonator and making said pulse long and strong enough to cause the superficial annealing and/or fusion of the sample and its subsequent re-crystallization.

BRIEF DESCRIPTION OF THE DRAWINGS

The invention will be more readily understood on reading the following description and referring to the drawings the single FIGURE of which illustrates an apparatus for carrying out a method for superficial annealing of semiconductor materials using pulsed microwave energy according to the present invention.

DETAILED DESCRIPTION OF THE PREFERRED EMBODIMENT

Referring now to the FIGURE, the method according to the invention for treating a semi-conductor material consists in placing the material 12 inside a cavity resonator generally designated 14 coupled by way of a waveguide 16, to a microwave generator 18, which can be constituted by a magnetron or preferably by a chain terminated by an amplifier klystron permitting to regulate or to modulate the produced radiation.

Such an installation is not being described here in details since its setting up calls on special technical knowledge from those skilled in the art, on the subject of microwave radiation and confinement. But the resonator 14 is coupled to the generator 18 in such a way as to absorb virtually all the power generated by the latter.

The part of the semi-conductor material to be treated during a pulse emission is situated in an area generally designated 19 where the electrical field is uniform, and it is disposed so as to form the reflecting wall of the resonator 14 and to constitute or to represent at least partly a reflecting wall of said resonator. Mobile short circuit terminations 20 are coupled to the resonator 14 in known manner.

The semi-conductor sample is subjected to the microwave energy for a pre-determined period, in order to raise its superficial temperature to the value required for the treatment.

For example, in order to re-structure into solid phase a sample of silicon decrystallized by ionic implantation, a power of about 1 kw is sent per $cm^2$ of material for 200 $\mu$secs. at a frequency of 8 GHz. With the generators found on the market it is then possible to treat with only one pulse, surfaces which can reach several scores of cm².

Still by way of example, a surface melting of the silicon can be obtained with a pulse of 2 kw per cm² for 200 μsecs at 8 GHz. But this kind of treatment should be much shorter, which would require much higher radiating powers, of the order of 200 kw per cm² for 1 μsec.

For easier performances, with large surfaces and power release availability with the currently marketed generators, it is advantageous to lower the frequency. But, all other things being equal, the required power density increases in reverse to the square root of the frequency.

Let us assume that $T_o$ is the characteristic time of distribution of the heat through the material over a depth equal to its skin depth for the frequency in question. If the pulse time is less than $T_o$, the treatment works on a depth substantially equal to skin depth; for example, with silicon, between 10 μm at 1 GHz. On the contrary, if the pulse time is greater than $T_o$, the treatment works to a depth which is substantially proportional to the square root of the pulse time. It is therefore possible by adjusting if necessary the power and duration of the microwave radiation, to carry out the different treatments indicated hereinabove, i.e. crystallizing a layer of amorphous semi-conductor material deposited on a substrate; re-crystallization into solid or fusion phase, then superficial re-crystallization of a crystalline material with a view to obtaining a crystal growing; structural reconstitution of a surface layer destroyed by ionic implantation of doping impurities; re-distribution of the doping impurities close to the surface of a semi-conductor material.

The method according to the invention can therefore be used for treating semi-conductors generally used in the construction of an important number of devices designed for various applications, such as diodes, transistors, integrated circuits, solar cells, etc.

One of the advantages of the method according to the invention resides in the fact that the virtually immediate rise in temperature and subsequent cooling enable to obtain treated zones of controllable and reproducible depths and surfaces conferring to the treated samples of semi-conductor material homogeneous characteristics. Also, in the case of surface melting, considering that the rise in temperature is obtained very quickly, if not instantaneously, any doping impurities which may be introduced beforehand in the semi-conductor material are instantaneously distributed evenly in the melted zone or through the thickness of the molten surface layer and penetrate only just, or not at all in the subjacent medium. So it is possible, in such an application, to obtain reproducible impurities doping profiles with steep front, from one sample to another.

Besides the possibility of controlling the depth of the treatment, it should be noted that in the method of the invention a low temperature gradient is imposed on the treated material, this giving only few internal stresses on the level of the limit areas between the exposed surface and the non-exposed surface.

Moreover, by being placed inside a cavity resonator, the semi-conductor material can absorb nearly all the energy produced by the generator. An 80% output of the produced energy is thus obtained which enables to perform the treatment at a low cost, compared with the currently known and used methods.

The method according to the invention can be used for treating doped or non-doped semi-conductor materials. Insofar as the material is not sufficiently conductive when cold, the method according to the invention is designed to make this material microwave-absorbent by free carriers generation effect. This effect is obtained by subjecting the semi-conductor material, at one time through the treatment, to wide-spectrum or narrow-spectrum bright radiations, depending on the nature of the material. In the latter case, the energy of the photons should be greater than the width of the forbidden band of the semi-conductor. By way of example, the radiation can be produced by a 300 W light source situated at 5 cm of the surface to be treated, these conditions being met when exposing a surface of 1 cm².

The illumination of the sample can be achieved by means of a guide 22, the outlet of which opens into the resonator 14 opposite to the material 12 to be treated, and connected to a suitable light source 24.

It may happen that the power involved is such that it entails too considerable a density of energy (with breakdowns appearing) in a resonator filled with air at the atmospheric pressure. In this case, the method according to the invention proposes to fill the cavity resonator with a dielectric material 26 of strong dielectric rigidity such as ethyl polytetrafluoride, transparent polystyrene, quartz, sulphur hexafluoride, compressed air or liquid paraffin.

Considering that the dielectric material used is polluting vis-à-vis the material to be treated, provisions are made to isolate the latter by introducing a window 28 which does not absorb the microwave radiations and is made from a material which will not pollute the sample of semi-conductor material. Such a window can be made of quartz for example.

The invention is in no way limited to the description given hereinabove and on the contrary, various modifications can be made thereto without departing from its scope.

What is claimed is:

1. A method for annealing the surface of a semiconductor material in a cavity resonator, comprising the steps of:
   placing the semiconductor material within the cavity resonator with the surface of the semiconductor material forming a reflecting wall portion of the cavity resonator; and
   coupling microwave energy having a preselected duration, power, and frequency to the cavity resonator for substantially instantaneously annealing the surface of the semiconductor material forming the reflecting wall portion of the cavity resonator by skin effect.

2. The invention of claim 1, wherein said preselected duration is selected between 500 ms and 10 μs, said preselected frequency is selected between 1 GHz and 12 GHz, and said preselected power selected between 500 W and 200 kW per cm² of surface.

3. The invention of claim 1, further including the step of filling the cavity resonator with a preselected dielectric material.

4. The invention of claim 1, further including the step of exposing the surface of the semiconductor material to light at a preselected wavelength simultaneously with said coupling step.

5. The invention of claim 3, wherein said preselected dielectric material is selected from the group consisting of ethylene polytetrafluoride, transparent polystyrene, quartz, sulphur hexafluoride, compressed air, and liquid paraffin.

6. The invention of claim 3, further including the step of isolating the surface of the semiconductor material from the dielectric material by placing a non-absorbent preselected dielectric window between the surface of the semiconductor material and the dielectric material selected to be non-pollutent for the semiconductor material forming the reflecting wall portion.

7. The invention of claim 4, wherein said exposing step includes the step of using a waveguide having an outlet which issues to the resonator at a point confronting the surface of the semiconductor material.

* * * * *